Figure 1:
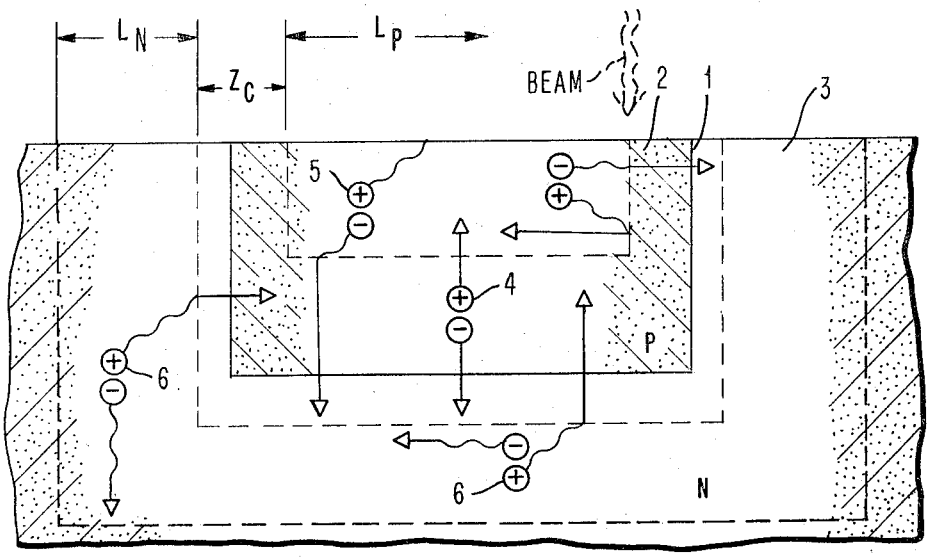
Figure 2:
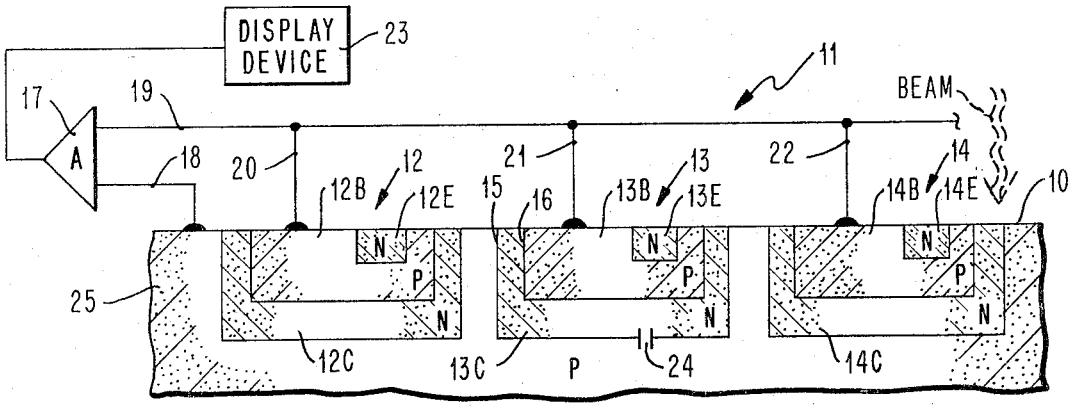
Figure 3:
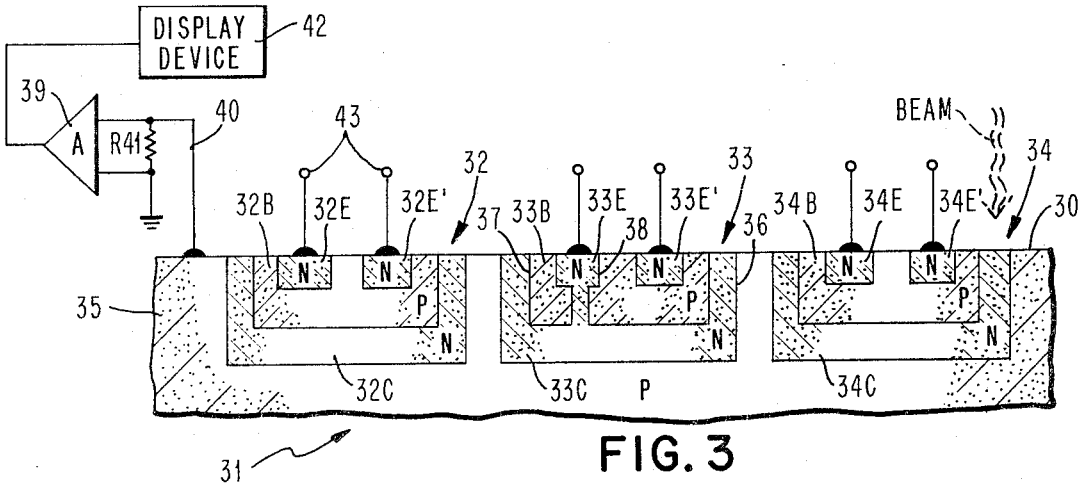
Figure 4:
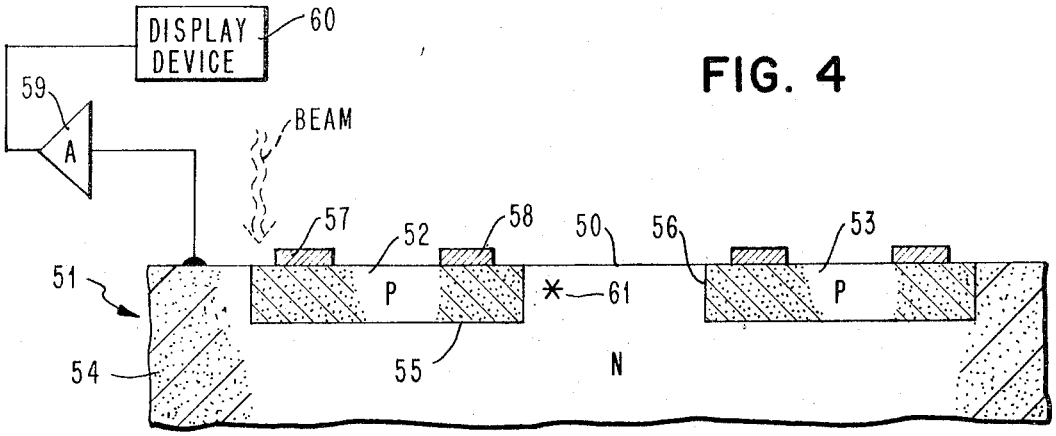
Figure 5A:
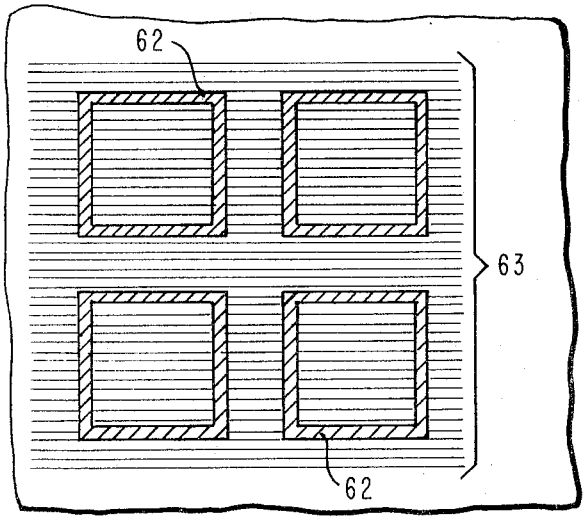
Figure 5B:
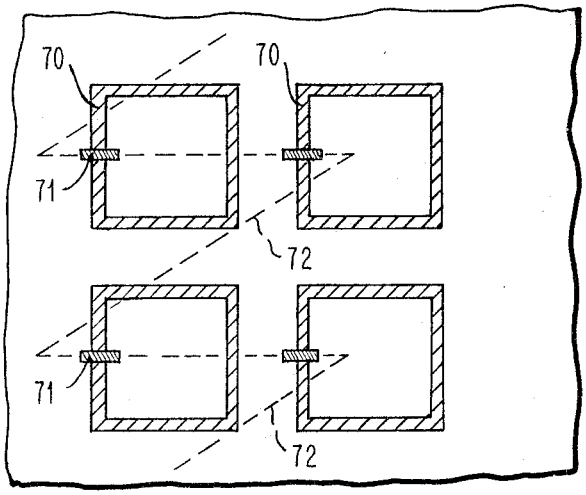

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JANUARY 7, 1975

930 O.G. 117

T930,006

PROCESS AND DEVICE FOR DETECTING DEFECTS IN A SEMICONDUCTOR ELEMENT

Pierre J. Beaufrere, Leparc; and Philippe Le Corneur, Des Platanes, France, assignors to International Business Machines Corporation, Armonk, N.Y.

Continuation of application Ser. No. 297,573, Oct. 13, 1972. This application Mar. 13, 1974, Ser. No. 450,704

Claims priority, application France, Dec. 29, 1971, 7147913

Int. Cl. G01r *31/02, 31/26*

U.S. Cl. 324—51

2 Sheets Drawing. 14 Pages Specification

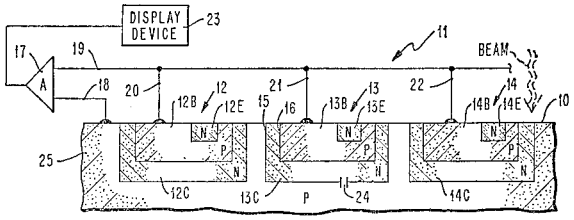

The apparatus is for checking the junctions of an integrated circuit driver by scanning the device surface with a beam, typically an electron beam. The beam acts as the source of an indirect current near a junction. Junctions are tested systematically by connecting similar combinations of regions in parallel and detecting with an amplifier induced signals produced by generated electron-hole pairs. The nature of the induced signals will vary from a norm when defects are present.